(12) United States Patent
Kim et al.

(10) Patent No.: US 7,782,688 B2
(45) Date of Patent: Aug. 24, 2010

(54) SEMICONDUCTOR MEMORY DEVICE AND TEST METHOD THEREOF

(75) Inventors: Yong-Jun Kim, Gyeonggi-do (KR); Woo-Seop Jeong, Gyeonggi-do (KR); Kyu-Chan Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 12/004,715

(22) Filed: Dec. 21, 2007

(65) Prior Publication Data

US 2008/0175080 A1 Jul. 24, 2008

(30) Foreign Application Priority Data

Jan. 10, 2007 (KR) .................. 10-2007-0002958

(51) Int. Cl.
*G11C 7/00* (2006.01)

(52) U.S. Cl. .................. 365/201; 365/63; 324/754; 714/724

(58) Field of Classification Search .................. 365/201, 365/63; 257/686, 786; 324/754, 756; 714/724
See application file for complete search history.

(56) References Cited

U.S. PATENT DOCUMENTS

| 6,323,664 | B1* | 11/2001 | Kim et al. ............. 324/754 |
| 6,351,405 | B1* | 2/2002 | Lee et al. .............. 365/63 |
| 6,849,956 | B2 | 2/2005 | Shigihara |
| 7,298,032 | B2 | 11/2007 | Kim et al. |
| 2003/0160624 | A1* | 8/2003 | Takemoto et al. ........... 324/754 |
| 2003/0214008 | A1 | 11/2003 | Shigihara |
| 2004/0201088 | A1 | 10/2004 | Kim et al. |
| 2005/0104184 | A1 | 5/2005 | Ahn et al. |
| 2005/0156616 | A1* | 7/2005 | Morishita et al. .......... 324/763 |
| 2006/0236172 | A1* | 10/2006 | Okamoto ................... 714/724 |

FOREIGN PATENT DOCUMENTS

| JP | 10-206464 | 8/1998 |
| JP | 2003-332450 | 11/2003 |
| KR | 1999-0061140 | 7/1999 |
| KR | 10-2004-0087501 | 10/2004 |
| KR | 10-2005-0046968 | 5/2005 |

* cited by examiner

*Primary Examiner*—Tuan T Nguyen
*Assistant Examiner*—Toan Le
(74) *Attorney, Agent, or Firm*—Mills & Onello, LLP

(57) ABSTRACT

Provided are a semiconductor memory device and a test method thereof. The semiconductor memory device includes: a die in which a plurality of internal circuits are integrated; a plurality of first and second channel pads having a first pad size and a first pad pitch, disposed in an alternating manner in a straight line at a center part of the die, and divided into a plurality of parallel rows, wherein the plurality of first and second channel pads are configured to selectively contact test probes in an alternating manner to receive an external wafer test signal and to output a signal generated by the plurality of internal circuits to the exterior. Therefore, it is possible to perform a test using plural channel pads during a wafer test of the semiconductor memory device using a plurality of probes of a probe card without incorrect contacts or non-contact with adjacent pads.

22 Claims, 5 Drawing Sheets

SEMICONDUCTOR MEMORY DEVICE AND TEST METHOD THEREOF

CROSS-REFERENCE TO RELATED APPLICATION

This application claims priority under 35 U.S.C. §119 to Korean Patent Application No. 10-2007-0002958, filed Jan. 10, 2007, the disclosure of which is hereby incorporated herein by reference in its entirety.

BACKGROUND OF THE INVENTION

1. Field of the Invention

The present invention relates to a semiconductor device memory, and more particularly, to a semiconductor memory device and a test method thereof capable of more stably and effectively performing a wafer test of the semiconductor memory device having a small pad size and a small interval between pads.

2. Description of the Related Art

Generally, a test process of a semiconductor memory device can be classified into a wafer test performed before a wafer is assembled and a package test performed in a package state after assembly. The wafer test can be classified into a pre-laser test performed before a laser repair process and an electronic die sorting (EDS) test performed after the laser repair process.

In particular, since the wafer test is performed in a wafer state before assembly, a tool called a "probe" should be in direct contact with a pad on a die. Generally, the probe has a plurality of needle-shaped pins disposed at predetermined intervals corresponding to pads.

Specifically, a probe card includes a plurality of probes, and the probes simultaneously contact the plurality of pads of the semiconductor memory device to input a necessary test signal and detect an output signal, so that it is determined whether or not the semiconductor memory device is good or bad on the basis of the detection of the output signal.

Meanwhile, maintaining a high bandwidth of the semiconductor memory device is still necessary. It is especially necessary to increase the number of input/output data bits corresponding to the number of simultaneously accessible data pins in order to increase a system operating speed of a semiconductor memory device for a mobile electronic appliance. In particular, fully independently operating command pins or input/output data pins should be implemented in a single semiconductor chip. Therefore, expansion of the input/output data bits makes it difficult to reduce a chip size and fabricate a package.

For example, in the case of a ball grid array (BGA) package, when the input/output data bit number is 256 bits, more than 500 ball-outs are required to fabricate the package. However, since the currently used BGA package has 225-460 pins, it is almost impossible to fabricate a package including 500 ball-outs or more.

In particular, since it is unmarketable to employ the BGA package to a semiconductor memory device for a mobile electronic appliance requiring a small package, new package manufacturing technologies, for example, p-bump (micro bump) technology, and so on, have been developed.

Micro bump technology is a pad fabricating technology for directly connecting pads without interconnections by parallely positioning both sides of pads to correspond to interface signals required between both chips, using the fact that a controller semiconductor chip of a mobile electronic appliance accesses a semiconductor memory device chip in a point-to-point manner.

As a result, it is possible to reduce a pad pitch, i.e., an interval between pads. However, when the wafer of the semiconductor memory device fabricated as described above is tested, it can be impossible to perform the pad probing.

Specifically, a needle of a probe has a thickness of about 15 μm, and an error of about 5 μm or more is generated during positioning of the probe. When the probe needle inappropriately contacts the pad, a contact error is generated, thereby making it difficult to properly perform the test. As a result, when the pad has a width or length of 35 μm or less, it is difficult to obtain a secure contact, and when the pad pitch, i.e., an interval between pads, is smaller than 50 μm, the probe needle could be in bad contact with adjacent pads.

Therefore, when the circuit integration density of the semiconductor memory device increases to reduce a chip size, a pad size and a pad pitch should be reduced corresponding to a reduction of the semiconductor chip size.

FIG. 1 illustrates a configuration for a wafer test of a semiconductor memory device having a conventional center pad structure. Two rows of pads 11 and 12 are disposed at a center part of a die 10, and the pads are connected to a plurality of probes 15-1 to 15-N of a probe card, respectively. The two rows of pads 11 and 12 include a first row of pads 11 formed of a plurality of pads for a first channel 11-1 to 11-N, and a second row of pads 12 formed of a plurality of pads for a second channel 12-1 to 12-N.

The center pad structure is a pad structure in which a plurality of rows of pads are disposed at a center part of a die 10. Since recent semiconductor memory has been densely integrated to accomplish large storage capacity, a memory cell array region should be large. However, since a pad region is limited, the center pad structure is widely used to obtain a layout well matched with the memory cell array.

Hereinafter, functions of respective components and a wafer test method will be described.

A plurality of separated chips is disposed at a die 10 after completing the semiconductor wafer process. A plurality of internal circuits are integrated in the semiconductor memory device, and two rows of pads 11 and 12 are parallely disposed at a center part of the die 10.

The first row of pads 11 formed of a plurality of pads for a first channel 11-1 to 11-N are connected to several circuits of the internal circuits of the semiconductor memory device, and the second row of pads 12 formed of a plurality of pads for a second channel 12-1 to 12-N are connected to the other circuits, except for the several pads connected to the first channel pads 11-1 to 11-N, thereby transmitting and receiving a command signal, an address signal, a data signal, a control signal, and so on, to and from the exterior of the semiconductor chip.

A plurality of probes 15-1 to 15-N of the probe card are a plurality of long and sharp pins in direct contact with the two rows of pads 11 and 12 to input a desired signal generated from a tester (not shown), and receive a signal generated by the internal circuits to transmit the signal to the tester, thereby performing a failure analysis and a redundancy cell analysis of the semiconductor memory device.

At this time, the two rows of pads 11 and 12 are disposed at the center part of the die 10, and the plurality of first and second channel pads 11-1 to 11-N and 12-1 to 12-N are disposed in parallel with a certain pad size at predetermined pad pitches in two divided rows.

When the pads are disposed in a multi-row manner as shown in FIG. 1, since it is limiting to bond each pad to a lead end using a wire, the probe should be in contact with the wafer chip from both sides thereof, thus making it difficult to simultaneously test a plurality of chips.

In addition, since the bonding wire is formed at both sides of the chip, the probes 15-1 to 15-N of the probe card can hardly contact the chip after the wire bonding, thus making it difficult to measure the signal amplitude on a signal line and observe a waveform during development of a product.

That is, since the pad structure shown in FIG. 1 can hardly perform the wire bonding when the lead is not introduced in an upper or lower direction of the die 10, it is difficult to use the pad structure in a package for extracting the lead from one side of the chip such as a surface vertical package (SVP) or a zigzag in-line package (ZIP).

In addition, since the probes 15-1 to 15-N of the probe card should be in contact with both sides of the chip while probing the semiconductor chip in a wafer state, it is difficult to simultaneously test a plurality of chips. Further, since the bonding wire is formed at both sides of the chip after the wire bonding, it is difficult to contact the probes 15-1 to 15-N of the probe card with the chip, thus causing incorrect measurement of an internal signal.

In particular, since the micro bump pad has a pad size and a pad pitch substantially smaller than those of the pad used in the wafer probing of the conventional different packages, it is difficult to perform a wafer test using a probe card and it is impossible to perform various types of tests.

SUMMARY OF THE INVENTION

An embodiment of the invention provides a semiconductor memory device having a pad arrangement for fabricating a probe card capable of minimizing the number of pads during a wafer test of the semiconductor memory device requiring a small pad interval.

Another embodiment of the invention provides a test method of a semiconductor memory device having a pad arrangement for fabricating a probe card capable of minimizing the number of pads during a wafer test of the semiconductor memory device requiring a small pad interval to detect whether the semiconductor memory device is operating normally.

One aspect of the invention is directed to a semiconductor memory device including: a die in which a plurality of internal circuits are integrated; and a plurality of first and second channel pads having a first pad size and a first pad pitch, disposed in an alternating manner in a straight line at a center part of the die, and divided into a plurality of parallel rows, wherein the plurality of first and second channel pads are configured to selectively contact test probes in an alternating manner to receive an external wafer test signal and output a signal generated by the plurality of internal circuits external to the semiconductor device.

The semiconductor device can be configured to be wafer tested by a probe card having a pad pitch corresponding to one of the first channel pads and the second channel pads can, and wherein the probe card can also test the semiconductor device through the other of the first channel pads and the second channel pads.

The semiconductor device can be configured so that when a first wafer test is completed through one of the first channel pads and the second channel pads, a lateral movement corresponding to the pad pitch of the semiconductor device relative to the probe card enables a second wafer test to be performed through the other of the first channel pads and the second channel pads.

The plurality of first and second channel pads can have a pad size larger than the first pad size and a pad pitch larger than the first pad pitch, can be disposed in parallel in a straight line at a center part of the die, and can be divided into the plurality of multiple rows.

The semiconductor device can be configured so that when a first wafer test is completed through one of the first channel pads and the second channel pads, a vertical movement corresponding to the pad pitch of the semiconductor device relative to the probe card enables a second wafer test to be performed through the other of the first channel pads and the second channel pads.

Another aspect of the present invention is directed to a semiconductor memory device including: a die in which a plurality of internal circuits are integrated; a plurality of pairs of first and second channel pads having a certain pad size and a certain pad pitch, disposed in an alternating manner in a straight line at a center part of the die, and divided into a plurality of parallel rows; a mode register for receiving an external mode setting code through predetermined pads of the plurality of pairs of first and second channel pads to output a mode setting signal for controlling a normal mode, or a first or second test mode; a switch control circuit for receiving the mode setting signal to output a switch control signal for connecting the plurality of pairs of first and second channel pads to a plurality of internal circuits, respectively, according to the normal mode or the first or second test mode; and a plurality of switching parts including a plurality of switches for connecting or disconnecting one of the plurality of pairs of first and second channel pads or the other of the plurality of first and second channel pads to or from the plurality of internal circuits, respectively, according to the switch control signal, wherein the plurality of pairs of first and second channel pads are configured to selectively contact test probes in an alternating manner during the first or second test mode to receive an external wafer test signal and output a signal generated by the plurality of internal circuits.

The semiconductor device can be configured to be wafer tested by a probe card having a pad pitch corresponding to one of the plurality of first channel pads and the plurality of second channel pads, and wherein the probe card can also test the semiconductor device using the other of the plurality of first channel pads and the plurality of second channel pads.

The semiconductor device can be configured so that when a first wafer test is completed through one of the plurality of pairs of first channel pads and the plurality of pairs of second channel pads, a lateral movement corresponding to the pad pitch of the semiconductor device relative to the probe card enables a second wafer test to be performed through the other of the plurality of pairs of first channel pads and the plurality of pairs of second channel pads.

The mode register can be connected to a plurality of address pads from among the plurality of pairs of first and second channel pads, the plurality of address pads configured to receive the mode setting code for entry and release of a first or second test mode, application of test items from the plurality of internal circuits, and test-related control signals, and to output the mode setting signal using a set of predetermined bits of the mode setting code.

The mode register can represent ON and OFF states of the plurality of switches from the plurality of switching parts according to the normal mode and the first and second test modes using a set of predetermined bits of the mode setting signal.

The plurality of internal circuits can include: a plurality of input buffers configured to receive a plurality of address signals, a plurality of data signals, and a plurality of control signals input through the plurality of pairs of first and second channel pads to output the signals after delaying the same for a predetermined time; a plurality of internal input circuits configured to receive the plurality of address signals, the plurality of data signals, and the plurality of control signals from the plurality of input buffers to perform independent operations, and to output internal operation signals required for performing an internal operation of the semiconductor memory device; a plurality of internal output circuits configured to receive the internal operation signals from the plurality of internal input circuits to perform independent operations, and to output output signals external to the semiconductor memory device; and a plurality of output buffers configured to receive the output signals output from the plurality of internal output circuits and to output the signals after delaying the same for a predetermined time.

The plurality of switches can include: a first switch configured to electrically connect or disconnect the plurality of first channel pads of the plurality of pairs of first and second channel pads to or from the plurality of input buffers or the plurality of output buffers; a second switch configured to electrically connect or disconnect the plurality of second channel pads of the plurality of pairs of first and second channel pads to or from the plurality of input buffers or the plurality of output buffers; and a third switch configured to electrically connect or disconnect the plurality of pairs of first and second channel pads to or from each other.

The first and second switches can be turned ON and the third switch can be turned OFF during the normal mode, the first and third switches can be turned ON and the second switch can be turned OFF during the first test mode, and the second and third switches can be turned ON and the first switch can be turned OFF during the second test mode.

Another aspect of the present invention is directed to a test method for a semiconductor memory device. The semiconductor device includes: a die in which a plurality of internal circuits are integrated; and a plurality of first and second channel pads having a first pad size and a first pad pitch, disposed in an alternating manner in a straight line at a center part of the die, and divided into a plurality of parallel rows. The method comprises: receiving an external wafer test signal by selectively contacting the plurality of first and second channel pads with test probes in an alternating manner; and externally outputting a signal generated by the plurality of internal circuits to detect whether the semiconductor memory device is operating normally.

The method can include providing a probe card having a pad pitch corresponding to one of the plurality of first channel pads and the plurality of second channel pads, and testing semiconductor device using the probe card through the other of the plurality of first channel pads and the plurality of second channel pads.

When a first wafer test is completed through one of the plurality of first channel pads and the plurality of second channel pads, the method can comprise performing a second wafer test through the other of the plurality of first channel pads and the plurality of second channel pads by laterally moving the wafer to be tested or the probe card by the pad pitch.

The plurality of first and second channel pads can have a pad size larger than the first pad size and a pad pitch larger than the first pad pitch, can be parallely disposed in a straight line at a center part of the die, and can be divided into the plurality of multiple rows.

When a first wafer test is completed through one of the plurality of first channel pads and the plurality of second channel pads, the method can comprise performing a second wafer test through the other of the plurality of first channel pads and the plurality of second channel pads by vertically moving the wafer to be tested or the probe card by the pad pitch.

Yet another aspect of the present invention is directed to a test method for a semiconductor memory device. The semiconductor device includes: a die in which a plurality of internal circuits are integrated; a plurality of pairs of first and second channel pads having a certain pad size and a certain pad pitch, disposed in an alternating manner in a straight line at a center part of the die, and divided into a plurality of parallel rows; a mode register for receiving an external mode setting code through predetermined pads of the plurality of pairs of first and second channel pads to output a mode setting signal for controlling a normal mode, or a first or second test mode; a switch control circuit for receiving the mode setting signal to output a switch control signal for connecting the plurality of pairs of first and second channel pads to a plurality of internal circuits, respectively, according to the normal mode or the first or second test mode; and a plurality of switching parts including a plurality of switches for connecting or disconnecting the plurality of pairs of first and second channel pads or the plurality of first and second channel pads to or from the plurality of internal circuits, respectively, according to the switch control signal. The test method comprises: selectively contacting the plurality of pairs of first and second channel pads with test probes in an alternating manner during the first or second test mode to receive an external wafer test signal; and outputting a signal generated by the plurality of internal circuits to detect whether the semiconductor memory device is operating normally.

The test method can include providing a probe card having a pad pitch corresponding to one of the plurality of first channel pads and the plurality of second channel pads, and testing the semiconductor device using the probe card can test through the other of the plurality of first channel pads and the plurality of second channel pads.

When a first wafer test is completed through one of the plurality of first channel pads and the plurality of second channel pads, the method can comprise performing a second wafer test through the other of the plurality of first channel pads and the plurality of second channel pads by laterally moving the wafer to be tested or the probe card by the pad pitch.

The plurality of internal circuits can include: a plurality of input buffers for receiving a plurality of address signals, a plurality of data signals, and a plurality of control signals input through the plurality of pairs of first and second channel pads to output the signals after delaying the same for a predetermined time; a plurality of internal input circuits for receiving the plurality of address signals, the plurality of data signals, and the plurality of control signals from the plurality of input buffers to perform independent operations, and outputting internal operation signals required for performing an internal operation of the semiconductor memory device; a plurality of internal output circuits for receiving the internal operation signals from the plurality of internal input circuits to perform independent operations, and outputting output signals external to the semiconductor memory device; and a plurality of output buffers for receiving the output signals output from the plurality of internal output circuits and outputting the signals after delaying the same for a predetermined time.

The plurality of switches can include: a first switch for electrically connecting or disconnecting the plurality of first channel pads of the plurality of pairs of first and second channel pads to or from the plurality of input buffers or the plurality of output buffers; a second switch for electrically connecting or disconnecting the plurality of second channel pads of the plurality of pairs of first and second channel pads to or from the plurality of input buffers or the plurality of output buffers; and a third switch for electrically connecting or disconnecting the plurality of pairs of first and second channel pads to or from each other.

The first and second switches can be turned ON and the third switch can be turned OFF during the normal mode, the first and third switches can be turned ON and the second switch can be turned OFF during the first test mode, and the second and third switches can be turned ON and the first switch can be turned OFF during the second test mode.

BRIEF DESCRIPTION OF THE DRAWINGS

Aspects of the invention will be apparent from the more particular description of an exemplary embodiment in accordance with the invention, as illustrated in the accompanying drawings. The drawings are not necessarily to scale, emphasis instead being placed upon illustrating the principles of the invention.

DETAILED DESCRIPTION OF ILLUSTRATIVE EMBODIMENTS

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

A wafer test method for a semiconductor memory device having a center pad structure in accordance with the present invention will now be described more fully hereinafter with reference to the accompanying drawings, in which exemplary embodiments in accordance therewith are shown.

Figure 2:
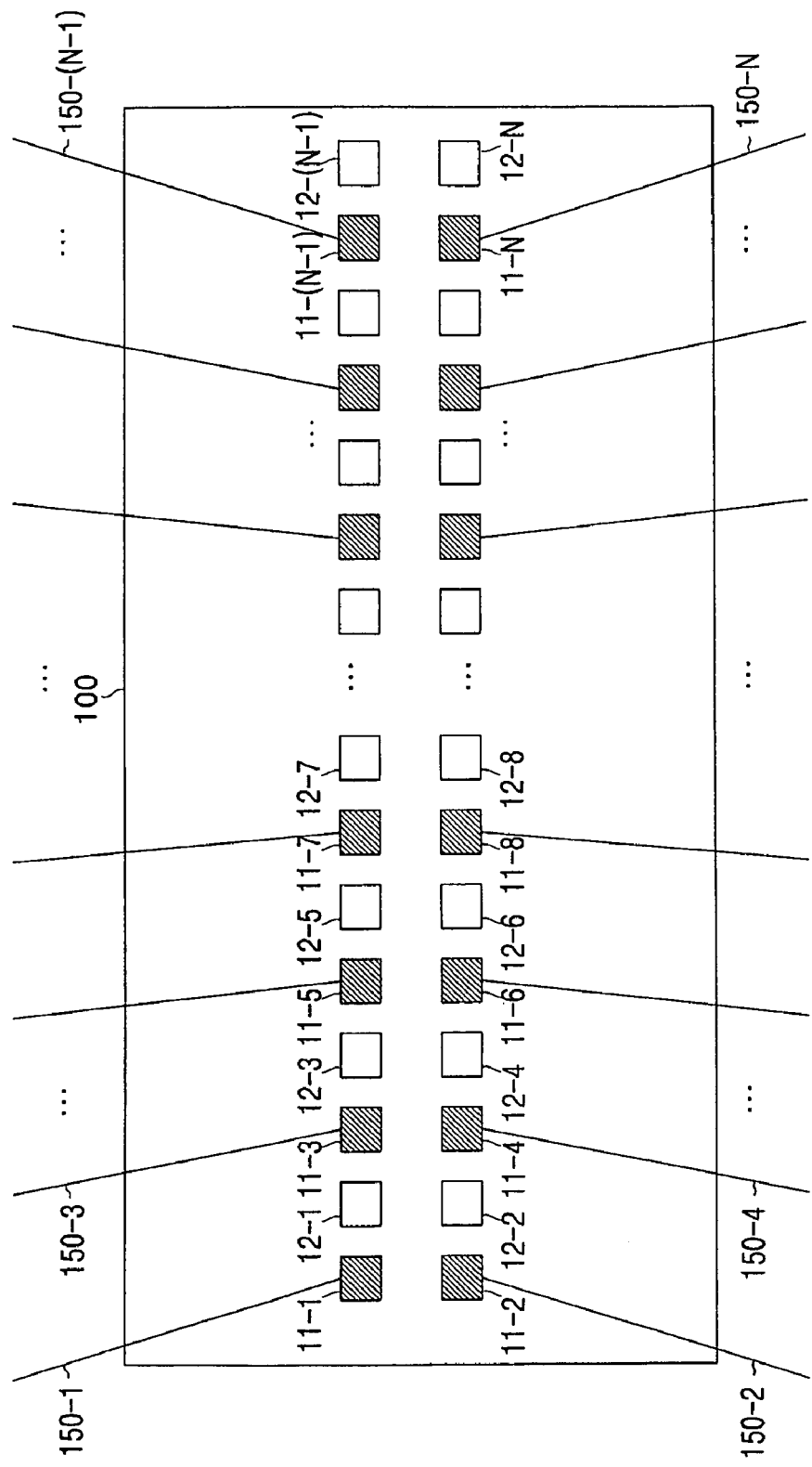
FIG. 2 illustrates a first exemplary embodiment of a configuration for a wafer test of a semiconductor memory device having a center pad structure in accordance with one aspect of the present invention.

FIG. 2 illustrates a first exemplary embodiment of a configuration for a wafer test of a semiconductor memory device having a center pad structure in accordance with a first one aspect of the present invention. Two rows of pads are disposed at a center part of a die 10, and a plurality of probes 150-1 to 150-N are connected to the pads 11-1 to 11-N arranged in an alternating order, respectively. The two rows of pads are divided into a plurality of pads for a first channel 11-1 to 11-N and a plurality of pads for a second channel 12-1 to 12-N, which are disposed in parallel with one another in an alternating manner.

Hereinafter, functions of components shown in FIG. 2 and a wafer test method shown will be described.

The semiconductor memory device includes a die 100 in which a plurality of internal circuits are integrated and two rows of pads are parallely disposed at a center part thereof. The two rows of pads are composed of the plurality of first and second channel pads 11-1 to 11-N and 12-1 to 12-N connected to some circuits of the plurality of internal circuits to transmit and receive a command signal, an address signal, a data signal, a control signal, and so on, to and from the semiconductor chip. Functions of the two rows of pads are similar to the conventional wafer test apparatus for a semiconductor memory device having the center pad structure shown and described with respect to FIG. 1, and thus, description thereof will not be repeated.

Figure 1:
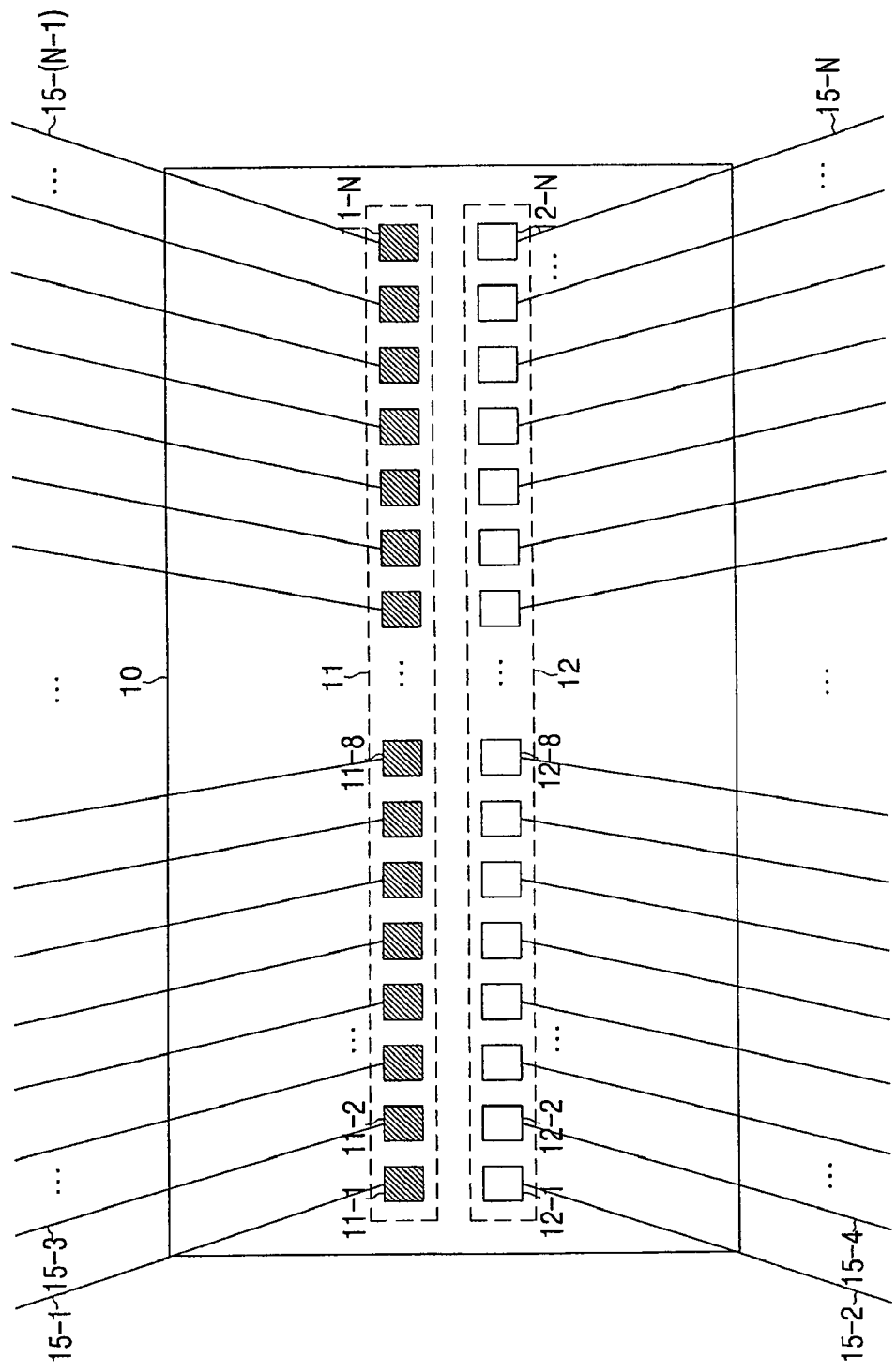
FIG. 1 illustrates a configuration for a wafer test of a semiconductor memory device having a prior art center pad structure.

However, in contrast to FIG. 1, the plurality of probes 150-1 to 150-N of the probe card selectively contact the first or second pads from the plurality of first or second channel pads 11-1 to 11-N or 12-1 to 12-N, rather than there being one probe contacting each pad in each of the two rows of pads. The plurality of probes and channel pads are configured to input a desired signal generated from a tester and transmit a signal generated by the plurality of internal circuits (not shown) of the semiconductor memory device to the tester.

In addition, the plurality of first and second channel pads 11-1 to 11-N and 12-1 to 12-N are divided into two rows and parallely disposed in an alternating manner, rather than parallely and continuously disposed in a straight line, with a predetermined pad size and pad pitch.

In this process, a channel means a structure including a plurality of rows of input/output pads parallely disposed at a center part of the die 100 and independently operating in the internal circuit of the semiconductor memory device to perform input/output external to the chip. Therefore, a two-channel pad structure means that there are two independently operating input/output pads.

As a result, in the two-channel pad structure, a plurality of semiconductor memory devices can be sequentially tested, rather than simultaneously tested in parallel.

That is, as shown in FIG. 2, when a wafer test is performed after increasing pad pitches of one of the first channel pads and the second channel pads, and then the other of the first channel pads and the second channel pads are spaced apart from one another by the pad pitch, it is possible to fabricate a probe card having the large pad pitch of the one of the first channel pads and the second channel pads, and perform a test through the other of the first channel pads and the second channel pads using the probe card.

In addition, in order to contact the probe with the pad of the wafer during the wafer test, the probe should be aligned with the pad. For this purpose, the wafer can be moved to a desired position in a desired direction to perform the alignment in a state that the probe having a large volume is fixed.

Therefore, when the wafer test is completed through the channel pads, the wafer or the probe card is moved by the pad pitch to perform the wafer test through the other channel pads so that all tests can be completed through the plurality of channel pads without incorrect contacts with adjacent pads of the plurality of probes 150-1 to 150-N of the probe card having large pad pitches.

Figure 3:
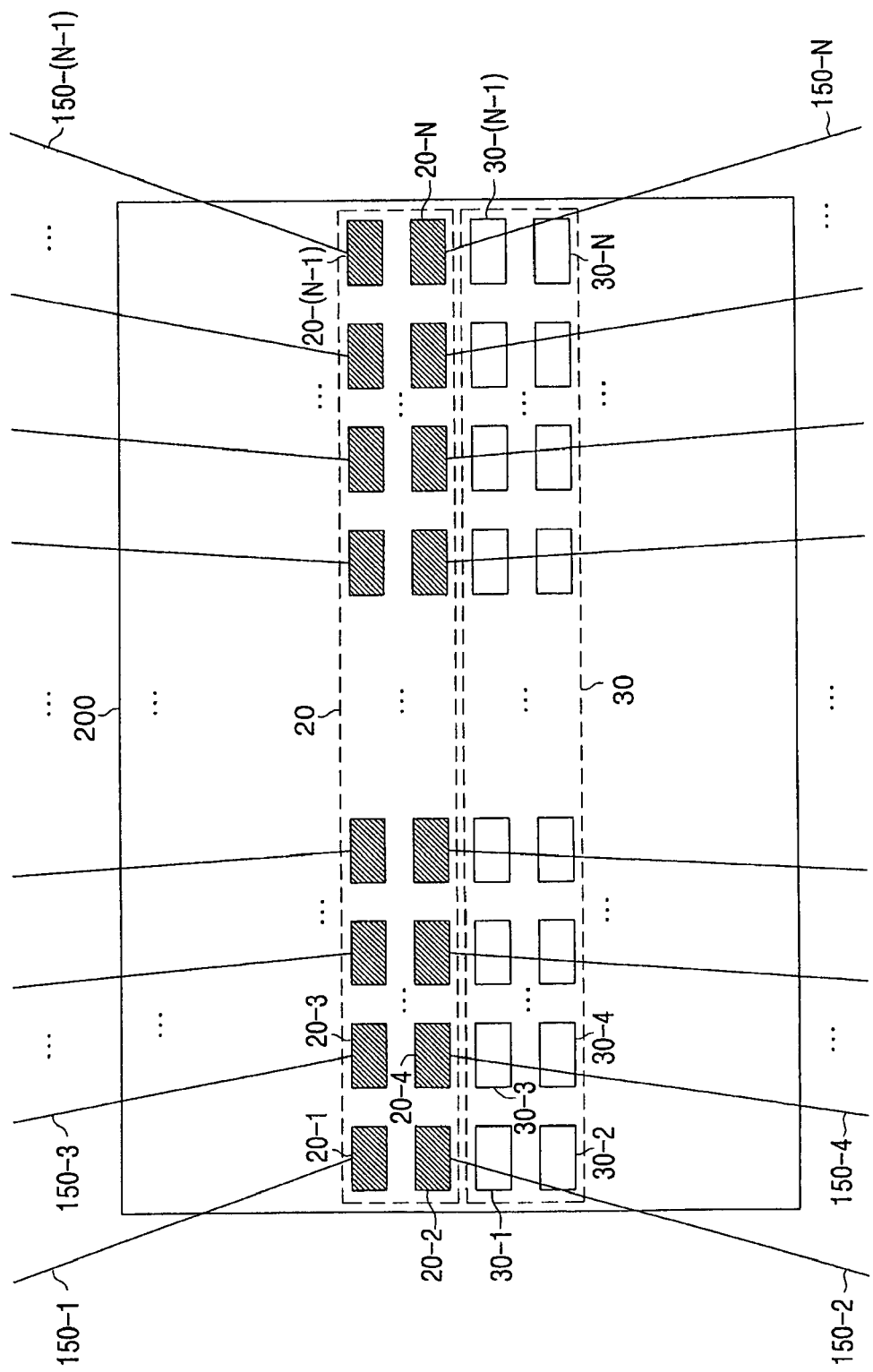
FIG. 3 illustrates a second exemplary embodiment of a configuration for a wafer test of a semiconductor memory device having a center pad structure in accordance with another aspect of the present invention.

FIG. 3 illustrates a second exemplary embodiment of a configuration for a wafer test of a semiconductor memory device having a center pad structure in accordance with another aspect of the present invention. Four rows of pads 20 and 30 are disposed at a center part of a die 200, the four rows of pads 20 and 30 include first and second rows of pads 20 composed of a plurality of pads for a first channel 20-1 to 20-N, and third and fourth rows of pads 30 composed of a plurality of pads for a second channel 30-1 to 30-N.

Hereinafter, functions of components shown in FIG. 3 and a wafer test method will be described.

The semiconductor memory device includes a die 200 in which a plurality of internal circuits are integrated. A plurality of first and second channel pads 20-1 to 20-N and 30-1 to 30-N are connected to some circuits of the plurality of internal circuits to transmit and receive a command signal, an address signal, a data signal, a control signal, and so on, to and from the exterior of the semiconductor chip. Functions of the channel pads are similar to the conventional wafer test apparatus for a semiconductor memory device having the center pad structure shown and described with respect to FIG. 1, and thus, description thereof will not be repeated.

However, in contrast to FIG. 2, four rows of pads 20 and 30 having a relatively large pad size and pad pitch, rather than two rows of pads having a small pad size and pad pitch, are continuously disposed at a center part of the die 200 in a straight line. In addition, the plurality of first and second channel pads 20-1 to 20-N and 30-1 to 30-N are aligned in two rows at large pitches, rather than one row at small pitches, to be electrically connected to the plurality of internal circuits of the semiconductor memory device. Further, a plurality of probes 150-1 to 150-N of the probe card selectively contact the first and second pads 20 composed of the plurality of first channel pads 20-1 to 20-N, or the third and fourth pads 30 composed of the plurality of second channel pads 30-1 to 30-N, rather than contact the plurality of first and second channel pads divided into two rows and having a small interval corresponding to a small pad pitch.

It is possible to solve this problem by enlarging only the pad pitch of the center pad structure shown in FIG. 2, because the plurality of probes 150-1 to 150-N of the probe card can incorrectly contact the plurality of first and second channel pads 20-1 to 20-N and 30-1 to 30-N due to a limitation of the pad size in the wafer test apparatus of the first embodiment.

That is, in order to overcome the problem, a plurality of pads are disposed to correspond to one channel in two rows to increase a pad size to fabricate the probe card having a large interval between the probes 150-1 to 150-N, thereby stably performing the test. Then, the test can be stably performed through the other of the first channel pads and the second channel pads using the probe card having the probes 150-1 to 150-N having the same interval.

In addition, in contrast to the test method of the first embodiment for testing a wafer having a large pad pitch shown in FIG. 2, when the wafer test is completed through one of the first channel pads and the second channel pads, the wafer or the probe card is vertically moved by an amount corresponding to the interval between the channel pads, rather than the pad pitch, to perform the wafer test through the other of the first channel pads and the second channel pads.

Therefore, it is possible to perform all tests through the plurality of channel pads having large pad size and pad pitch using the wafer test method for a semiconductor memory device having a center pad structure in accordance with a second exemplary embodiment shown in FIG. 3, thereby preventing incorrect contact of the plurality of probes 150-1 to 150-N of the probe card with adjacent pads or non-contact with the corresponding pad.

Figure 4:
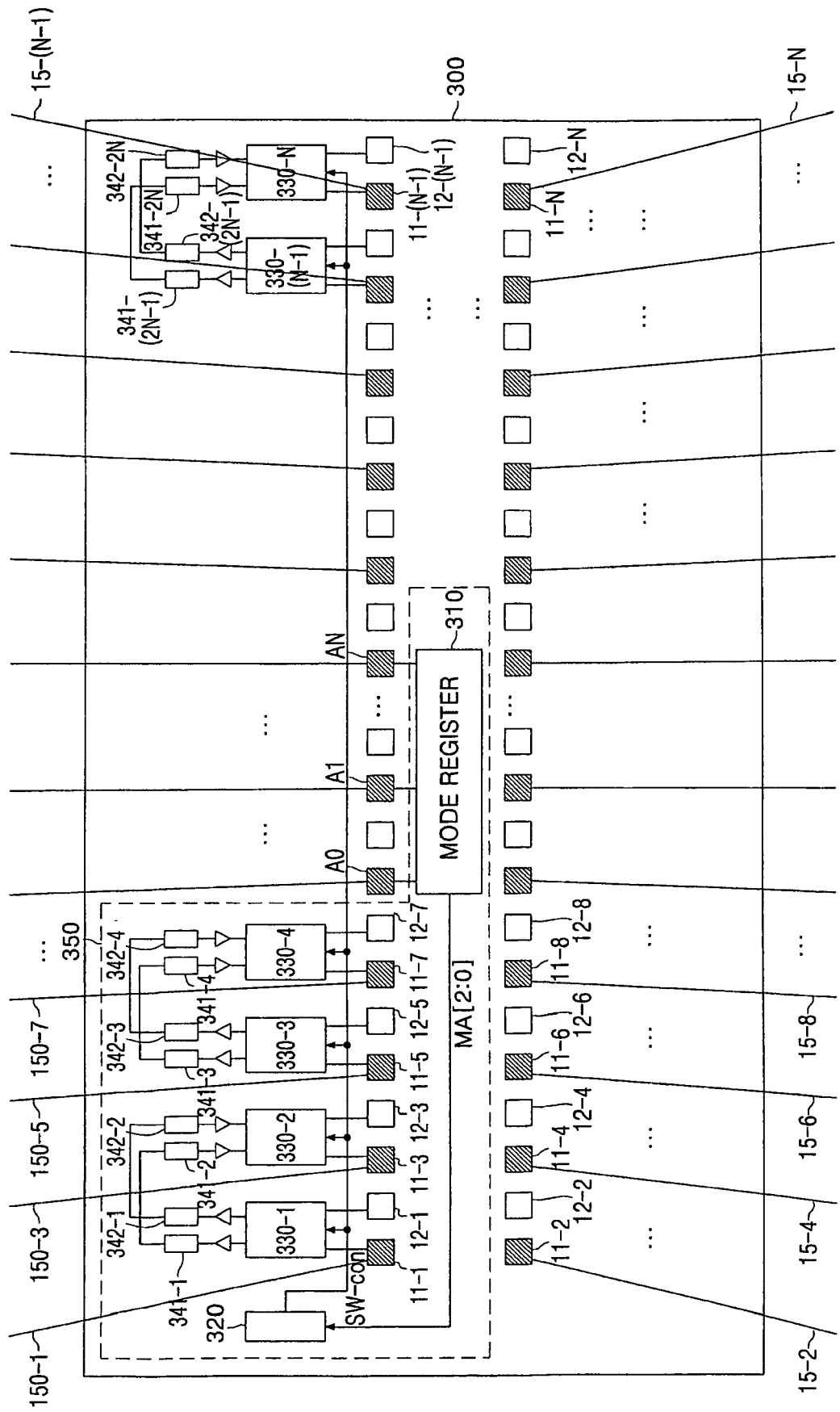
FIG. 4 illustrates a third exemplary embodiment of a configuration for a wafer test of a semiconductor memory device having a center pad structure in accordance with another aspect of the present invention.
Figure 5:
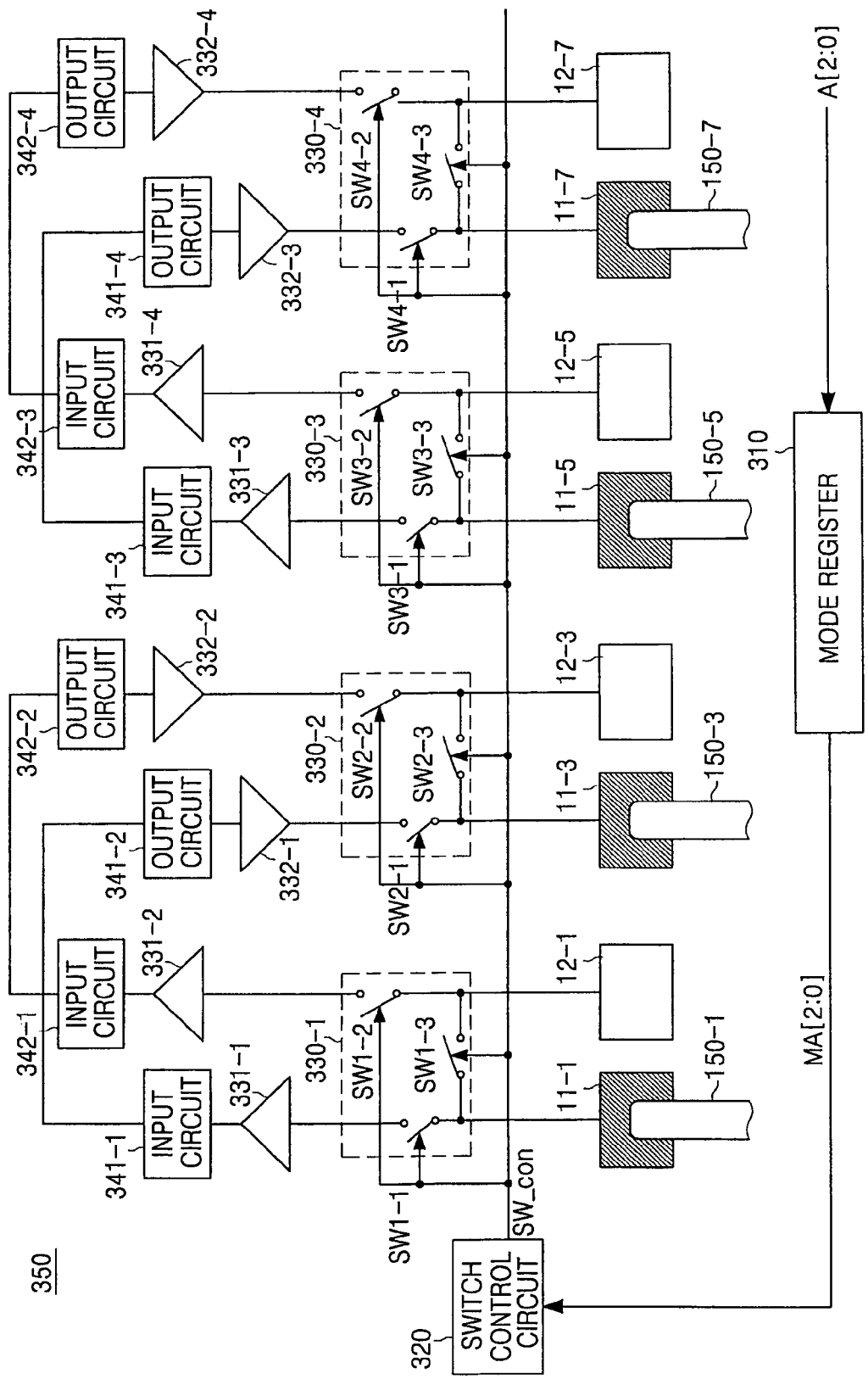
FIG. 5 is an enlarged view of embodiments of some components of the semiconductor memory device having a center pad structure in accordance with the third embodiment.

FIG. 4 illustrates a third exemplary embodiment of a configuration for a wafer test of a semiconductor memory device having a center pad structure in accordance with another aspect of the present invention. FIG. 5 is an enlarged view of embodiments of some components of the semiconductor memory device having a center pad structure in accordance with the third exemplary embodiment.

Referring to FIGS. 4 and 5, the semiconductor memory device includes two rows of pads 11-1 to 11-N, 12-1 to 12-N, a mode register 310, a switch control circuit 320, a plurality of switching parts 330-1 to 330-N, a plurality of input buffers 331-1 to 331-N, a plurality of output buffers 332-1 to 332-N, and a plurality of internal circuits 341-1 to 341-N and 342-1 to 342-N.

The plurality of internal circuits are composed of a plurality of first channel input circuits 341-1, 341-3, ... 341-(2N−1), a plurality of second channel input circuits 342-1, 342-3, ... 342-(2N−1), a plurality of first channel output circuits 341-2, 341-4, ... 341-2N, and a plurality of second channel output circuits 342-2, 342-4, ... 342-2N.

The two rows of pads 11-1 to 11-N and 12-1 to 12-N having a small pad size are disposed at a center part of a die 300. A plurality of probes 150-1 to 150-N of a probe card are connected to the pads arranged in an alternating order, respectively. The plurality of first channel pads 11-1 to 11-N and the plurality of second channel pads 12-1 to 12-N are parallely disposed in an alternating manner.

FIG. 5 illustrates only eight input and output pads 11-1, 11-3, 11-5, 11-7, 12-1, 12-3, 12-5 and 12-7 in the first row and circuit parts corresponding thereto for the convenience of understanding. However, the plurality of first and second channel pads 11-1 to 11-N and 12-1 to 12-N are disposed as shown in FIG. 4, and one first channel pad and one second channel pad constitute a pair of channel pads 11-1 and 12-1 or 11-N and 12-N. One switching part 330-$n$ is installed at each pair of channels. The one switching part is composed of first to third switches SWn-1, SWn-2 and SWn-3.

The first switch SWn-1 electrically connects or disconnects the plurality of first channel pads 11-1 to 11-N to and from the plurality of input buffers 331-1 to 331-N or the plurality of output buffers 332-1 to 332-N, respectively. The second switch SWn-2 electrically connects or disconnects the plurality of second channel pads 12-1 to 12-N to and from the plurality of input buffers 331-1 to 331-N or the plurality of output buffers 332-1 to 332-N, respectively. The third switch SWn-3 electrically connects or disconnects each pair of first and second channel pads 11-1 and 12-1 to 11-N and 12-N.

Functions of components shown in FIGS. 4 and 5 and a wafer test method will now be described.

Similar to the wafer test method for a semiconductor memory device having the center pad structure of the first embodiment shown in FIG. 2, the plurality of internal circuits 341-1 to 341-N and 342-1 to 342-N are integrated on the die 300, and the two rows of pads 11-1 to 11-N and 12-1 to 12-N are parallely disposed at a center part of the die 300. In addition, the plurality of first channel pads 11-1 to 11-N and the plurality of second channel pads 12-1 to 12-N are parallely disposed in an alternating manner and divided into two rows, rather than continuously aligned in a straight line with a certain pad size and pad pitch. Further, the plurality of probes 150-1 to 150-N of the probe card selectively contact the plurality of first or second channel pads 11-1 to 11-N or 12-1 to 12-N, rather than contact all the pads 11-1 to 11-N or 12-1 to 12-N, to input a desired signal generated from a tester and to receive a signal actually generated by the plurality of internal circuits 341-1 to 341-N and 342-1 to 342-N of the semiconductor memory device to transmit the signal to the tester. Since the wafer test method shown in FIGS. 4 and 5 is similar to the wafer test method for a semiconductor memory device having the center pad structure of the first embodiment shown in FIG. 2, detailed description thereof will not be repeated.

In contrast to the first embodiment, the plurality of first and second channel pads 11-1 to 11-N and 12-1 to 12-N are electrically connected to the plurality of internal circuits 341-1 to 341-N and 342-1 to 342-N of the semiconductor memory device by the plurality of switching parts 330-1 to 330-N, rather than directly connected to the plurality of input buffers 331-1 to 331-N or the plurality of output buffers 332-1 to 332-N.

In addition, in contrast to the pad arrangement method of the first embodiment, the plurality of first and second channel pads 11-1 to 11-N and 12-1 to 12-N having a certain pad size and pad pitch are parallely disposed in an alternating manner and divided into two rows to determine whether the electrical connection is made through the plurality of switching parts 330-1 to 331-N according to a normal mode and a test mode.

Hereinafter, functions of components shown in FIGS. 4 and 5, in contrast to the first embodiment of FIG. 2, will be described in detail.

A mode register 310 is connected to a plurality of address pads A1 to AN to receive an external mode setting code A[N:0] to thereby output signals for entry and release of a test mode, apply various test items from the plurality of internal circuits 341-1 to 341-N and 342-1 to 342-N, and ouput various test-related control signals. In this embodiment, a mode setting signal MA[2:0] for controlling ON and OFF of the plurality of switching parts 330-1 to 330-N is output using combinations of three bits A[2:0] of the mode setting codes.

The switch control circuit 320 receives the mode setting signal MA[2:0] from the mode register 310 to output a switch control signal SW_con for controlling ON and OFF of each switch SWn-1, SWn-2 or SWn-3 of the plurality of switching parts 330-1 to 330-N.

The plurality of switching parts 330-1 to 330-N turn ON and OFF the switches SWn-1, SWn-2 and SWn-3 in response to control of the switch control circuit 320, respectively, to connect the plurality of first and second channel pads 11-1 to 11-N and 12-1 to 12-N to the plurality of input buffers 331-1 to 331-N and the plurality of output buffers 332-1 to 332-N in a normal mode or a first or second channel internal circuit test mode.

The plurality of input buffers 331-1 to 331-N receive various address signals, data signals, control signals, and so on input through the plurality of first and second channel pads 11-1 to 11-N and 12-1 to 12-N, and output the signals after delaying the same for a predetermined time.

The plurality of internal input circuits 341-($2n-1$) and 342-($2n-1$) receive the various address signals, data signals, control signals, and so on from the plurality of input buffers 331-1 to 331-N, and perform an independent operation to output internal operation signals required for performing an internal operation of the semiconductor memory device.

The plurality of internal output circuits 341-($2n$) and 342-($2n$) receive internal operation signals from the plurality of internal input circuits 341-($2n-1$) and 342-($2n-1$), and perform an independent operation to output the output signals required for performing an external operation of the semiconductor memory device.

The plurality of output buffers 332-1 to 332-N receive the output signals output through the plurality of internal output circuits 341-($2n$) and 342-($2n$), and output the output signal after delaying the same for a predetermined time.

Hereinafter, operation of the wafer test method for a semiconductor memory device having a center pad structure in accordance with the third exemplary embodiment will be described with reference to FIGS. 4 and 5.

The test method of the third embodiment is a method of grouping some pads having the same function as the plurality of channels to operate all of the channels using a small number of pads during a wafer test operation of the semiconductor memory device.

For example, when a plurality of data input/output signal pads, a plurality of address signal pads, and some command signal pads are all connected to the plurality of channels in the semiconductor memory device during a test mode operation, and some control signal pads, such as a chip selection signal (CS), are used for the plurality of channels, respectively, it is possible to test all of the channels using the small number of pads.

In FIGS. 4 and 5, the mode register 310 receives a set of external mode setting signals MA[12:0] through the plurality of address pads A1 to AN used to determine the normal mode, the first channel internal circuit test mode, or the second channel internal circuit test mode using lower three bits MA[2:0], which represent ON and OFF states of the first to third switches SWn-1, SWn-2 and SWn-3 of each of the switching parts 330-1 to 330-N.

That is, a logic level value of the lower three bits MA[2:0] should be '110' during the normal mode because the first and second switches SWn-1 and SWn-2 should turned ON and the third switch SWn-3 should be turned OFF. In addition, a logic level value of the lower three bits MA[2:0] should be '101' during the first channel internal circuit test mode because the first and third switches SWn-1 and SWn-3 should be turned ON and the second switch SWn-2 should be turned OFF. Further, a logic level value of the lower three bits MA[2:0] should be '011' during the second channel internal circuit test mode because the first switch SWn-1 should be turned OFF and the second and third switches SWn-2 and SWn-3 should be turned ON.

First, when the mode register 310 receives a set of lower three bits MA[2:0] of an external mode setting signal MA[12:0] as '110' through the plurality of address pads A1 to AN and transmits the set '110' to the switch control circuit 320, the switch control circuit 320 detects a normal mode to output a switch control signal SW_con for controlling the first to third switches SWn-1, SWn-2 and SWn-3 in the plurality of switching parts 330-1 to 330-N.

When the switch control circuit 320 outputs the switch control signal SW_con to turn ON the first and second switches SWn-1 and SWn-2 ands 11-1 to 11-N and 12-1 to 12-N are directly connected to the plurality of input buffers 331-1 to 331-N or the plurality of output buffers 332-1 to 332-N, and at the same time, the plurality of first and second channel pads 11-1 to 11-N and 12-1 to 12-N are electrically disconnected from each other, thereby operating the semiconductor memory device normally.

Then, when the mode register 310 receives a set of lower three bits MA[2:0] of a mode setting signal MA[12:0] as '101' through the plurality of address pads A1 to AN from the exterior to transmit the set '101' to the switch control circuit 320, and the switch control circuit 320 detects a first channel internal circuit test mode to output a switch control signal SW_con for controlling the first to third switches SWn-1, SWn-2 and SWn-3 in the plurality of switching parts 330-1 to 330-N.

According to the switch control signal SW_con of the switch control circuit 320, the first and third switches SWn-1 and SWn-3 are turned ON to directly connect the plurality of first channel pads 11-1 to 11-N to the plurality of input buffers 331-1 to 331-N or the plurality of output buffers 332-1 to 332-N, and at the same time, to electrically connect the first and second channel pads 11-1 to 11-N and 12-1 to 12-N to each other such that the plurality of probes 150-1 to 150-N of the probe card are in secure contact with the plurality of first and second channel pads 11-1 to 11-N and 12-1 to 12-N. In addition, the second switch SWn-2 is turned OFF to disconnect the plurality of second channel pads 12-1 to 12-N from the plurality of input buffers 331-1 to 331-N or the plurality of output buffers 332-1 to 332-N. As a result, a first channel internal circuit test operation of the semiconductor memory device is performed.

Further, when the mode register 310 receives a set of lower three bits MA[2:0] of an external mode setting signal MA[12:0] as '011' through the plurality of address pads A1 to AN and transmits the set '011' to the switch control circuit 320, the switch control circuit 320 detects a second channel internal circuit test mode to output a switch control signal SW_con for controlling the first to third switches SWn-1, SWn-2 and SWn-3 in the plurality of switching parts 330-1 to 330-N.

According to the switch control signal SW_con of the switch control circuit 320, the first switch SWn-1 is turned OFF to disconnect the plurality of first channel pads 11-1 to 11-N from the plurality of input buffers 331-1 to 331-N or the plurality of output buffers 332-1 to 332-N. In addition, the second and third switches SWn-2 and SWn-3 are turned ON to directly connect the plurality of second channel pads 12-1 to 12-N to the plurality of input buffers 331-1 to 331-N or the plurality of output buffers 332-1 to 332-N, and at the same time, to electrically connect the first and second channel pads 11-1 to 11-N and 12-1 to 12-N to each other such that the plurality of probes 150-1 to 150-N of the probe card are in secure contact with the plurality of first and second channel pads 11-1 to 11-N and 12-1 to 12-N. As a result, a second channel internal circuit test operation of the semiconductor memory device is performed.

As described above, when the first and second channel internal circuits test operations of the semiconductor memory device are performed as shown in FIG. 5, the plurality of probes 150-1 to 150-N of the probe card simultaneously contact with the plurality of first and second channel pads 11-1 to 11-N and 12-1 to 12-N, and the mode register 310 is in contact with the plurality of address pads A1 to AN in which lower three bits MA[2:0] of a mode setting signal MA[12:0] among the plurality of first and second channel pads 11-1 to 11-N and 12-1 to 12-N are applied.

According to operations of the switch control circuit 320 and the plurality of switching parts 330-1 to 330-N, when the plurality of first or second channel internal circuits 341-1 to 341-N or 342-1 to 342-N are electrically connected to the plurality of first and second channel pads 11-1 to 11-N and 12-1 to 12-N, the plurality of probes 150-1 to 150-N of the probe card apply test input signals and then detect test output signals after performing a first or second channel internal circuit operation.

Therefore, in this embodiment, it is possible to solve the problem in which the plurality of probes 150-1 to 150-N of the probe card hardly contact the plurality of first and second channel pads 11-1 to 11-N and 12-1 to 12-N due to limitations of the pad size in the first pad pitch only in the center pad structure shown in FIG. 2, and to solve the problem in which the chip size is increased due to the increase in the number of pads in the second embodiment for testing a wafer by enlarging a pad pitch and a pad size of the center pad structure shown in FIG. 3.

As can be seen from the foregoing, a semiconductor memory device and a test method thereof in accordance with the present invention are capable of obtaining a secure contact with respect to pads by enlarging a pad pitch and a pad size during a wafer test of a semiconductor memory device, and performing all tests through a plurality of channel pads using a plurality of probes of a probe card without incorrect contact or non-contact with a pad region.

Exemplary embodiments have been disclosed herein and, although specific terms are employed, they are used and are to be interpreted in a generic and descriptive sense only and not for purpose of limitation. Accordingly, it will be understood by those of ordinary skill in the art that various changes in form and details can be made without departing from the spirit and scope of the present invention as set forth in the following claims.

What is claimed is:

1. A semiconductor memory device comprising:
    a die in which a plurality of internal circuits are integrated; and
    a plurality of first and second channel pads having a first pad size and a first pad pitch, disposed in an alternating manner in a straight line at a center part of the die, and divided into a plurality of parallel rows,
    wherein the plurality of first and second channel pads are configured to selectively contact test probes in an alternating manner to receive an external wafer test signal and to output a signal generated by the plurality of internal circuits external to the semiconductor device, and
    wherein the semiconductor device is configured so that when a first wafer test is completed through one of the first channel pads and the second channel pads, a lateral movement corresponding to the pad pitch of the semiconductor device relative to the probe card enables a second wafer test to be performed through the other of the first channel pads and the second channel pads.

2. The semiconductor memory device according to claim 1, wherein the semiconductor device is configured to be wafer tested by a probe card having a pad pitch corresponding to one of the first channel pads and the second channel pads, and wherein the probe card can also test the semiconductor device using the other of the first channel pads and the second channel pads.

3. The semiconductor memory device according to claim 1, wherein the plurality of first and second channel pads have a pad size larger than the first pad size and a pad pitch larger than the first pad pitch, disposed in parallel in a straight line at a center part of the die, and divided into the plurality of multiple rows.

4. The semiconductor memory device according to claim 3, wherein the semiconductor device is configured so that when a first wafer test is completed through one of the first channel pads and the second channel pads, a vertical movement corresponding to the pad pitch of the semiconductor device relative to the probe card enables a second wafer test to be performed through the other of the first channel pads and the second channel pads.

5. A semiconductor memory device comprising:
   a die in which a plurality of internal circuits are integrated;
   a plurality of pairs of first and second channel pads having a certain pad size and a certain pad pitch, disposed in an alternating manner in a straight line at a center part of the die, and divided into a plurality of parallel rows;
   a mode register for receiving an external mode setting code through predetermined pads of the plurality of pairs of first and second channel pads to output a mode setting signal for controlling a normal mode, or a first or second test mode;
   a switch control circuit for receiving the mode setting signal to output a switch control signal for connecting the plurality of pairs of first and second channel pads to a plurality of internal circuits, respectively, according to the normal mode or the first or second test mode; and
   a plurality of switching parts including a plurality of switches for connecting or disconnecting one of the plurality of pairs of first and second channel pads or the other of the plurality of first and second channel pads to or from the plurality of internal circuits, respectively, according to the switch control signal,
   wherein the plurality of pairs of first and second channel pads are configured to selectively contact test probes in an alternating manner during the first or second test mode to receive an external wafer test signal and output a signal generated by the plurality of internal circuits.

6. The semiconductor memory device according to claim 5, wherein the semiconductor device is configured to be wafer tested by a probe card having a pad pitch corresponding to one of the plurality of first channel pads and the plurality of second channel pads, and wherein the probe card can also test the semiconductor device using the other of the plurality of first channel pads and the plurality of second channel pads.

7. The semiconductor memory device according to claim 6, wherein the semiconductor device is configured so that when a first wafer test is completed through one of the plurality of pairs of first channel pads and the plurality of pairs of second channel pads, a lateral movement corresponding to the pad pitch of the semiconductor device relative to the probe card enables a second wafer test to be performed through the other of the plurality of pairs of first channel pads and the plurality of pairs of second channel pads.

8. The semiconductor memory device according to claim 5, wherein the mode register is connected to a plurality of address pads from among the plurality of pairs of first and second channel pads, the plurality of address pads configured to receive the mode setting code for entry and release of a first or second test mode, application of test items from the plurality of internal circuits, and test-related control signals, and to output the mode setting signal using a set of predetermined bits of the mode setting code.

9. The semiconductor memory device according to claim 8, wherein the mode register represents ON and OFF states of the plurality of switches from the plurality of switching parts according to the normal mode and the first and second test modes using a set of predetermined bits of the mode setting signal.

10. The semiconductor memory device according to claim 8, wherein the plurality of internal circuits comprise:
    a plurality of input buffers configured to receive a plurality of address signals, a plurality of data signals, and a plurality of control signals input through the plurality of pairs of first and second channel pads to output the signals after delaying the same for a predetermined time;
    a plurality of internal input circuits configured to receive the plurality of address signals, the plurality of data signals, and the plurality of control signals from the plurality of input buffers to perform independent operations, and to output internal operation signals required for performing an internal operation of the semiconductor memory device;
    a plurality of internal output circuits configured to receive the internal operation signals from the plurality of internal input circuits to perform independent operations, and to output output signals external to the semiconductor memory device; and
    a plurality of output buffers configured to receive the output signals output from the plurality of internal output circuits and to output the signals after delaying the same for a predetermined time.

11. The semiconductor memory device according to claim 5, wherein the plurality of switches comprises:
    a first switch configured to electrically connect or disconnect the plurality of first channel pads of the plurality of pairs of first and second channel pads to or from the plurality of input buffers or the plurality of output buffers;
    a second switch configured to electrically connect or disconnect the plurality of second channel pads of the plurality of pairs of first and second channel pads to or from the plurality of input buffers or the plurality of output buffers; and
    a third switch configured to electrically connect or disconnect the plurality of pairs of first and second channel pads to or from each other.

12. The semiconductor memory device according to claim 11, wherein the first and second switches are turned ON and the third switch is turned OFF during the normal mode, the first and third switches are turned ON and the second switch is turned OFF during the first test mode, and the second and third switches are turned ON and the first switch is turned OFF during the second test mode.

13. A test method for a semiconductor memory device comprising:
    the semiconductor device comprising a die in which a plurality of internal circuits are integrated; and a plurality of first and second channel pads having a first pad size and a first pad pitch, disposed in an alternating manner in a straight line at a center part of the die, and divided into a plurality of parallel rows,
    the method comprising:
    receiving an external wafer test signal by selectively contacting the plurality of first and second channel pads with test probes in an alternating manner; and
    externally outputting a signal generated by the plurality of internal circuits to detect whether the semiconductor memory device is operating normally, wherein, when a first wafer test is completed through one of the plurality of first channel pads and the plurality of second channel pads, the method comprises performing a second wafer test through the other of the plurality of first channel pads and the plurality of second channel pads by laterally moving the wafer to be tested or the probe card by the pad pitch.

14. The test method according to claim 13, providing a probe card having a pad pitch corresponding to one of the plurality of first channel pads and the plurality of second channel pads, and testing semiconductor device using the probe card through the other of the plurality of first channel pads and the plurality of second channel pads.

15. The test method according to claim 13, wherein the plurality of first and second channel pads have a pad size larger than the first pad size and a pad pitch larger than the first pad pitch, are parallely disposed in a straight line at a center part of the die, and are divided into the plurality of multiple rows.

16. The test method according to claim 15, wherein, when a first wafer test is completed through one of the plurality of first channel pads and the plurality of second channel pads, the method comprises performing a second wafer test through the other of the plurality of first channel pads and the plurality of second channel pads by vertically moving the wafer to be tested or the probe card by the pad pitch.

17. A test method for a semiconductor memory device comprising:
the semiconductor device comprising:
a die in which a plurality of internal circuits are integrated;
a plurality of pairs of first and second channel pads having a certain pad size and a certain pad pitch, disposed in an alternating manner in a straight line at a center part of the die, and divided into a plurality of parallel rows;
a mode register for receiving an external mode setting code through predetermined pads of the plurality of pairs of first and second channel pads to output a mode setting signal for controlling a normal mode, or a first or second test mode;
a switch control circuit for receiving the mode setting signal to output a switch control signal for connecting the plurality of pairs of first and second channel pads to a plurality of internal circuits, respectively, according to the normal mode or the first or second test mode; and
a plurality of switching parts including a plurality of switches for connecting or disconnecting the plurality of pairs of first and second channel pads or the plurality of first and second channel pads to or from the plurality of internal circuits, respectively, according to the switch control signal,
the test method comprising:
selectively contacting the plurality of pairs of first and second channel pads with test probes in an alternating manner during the first or second test mode to receive an external wafer test signal; and
outputting a signal generated by the plurality of internal circuits to detect whether the semiconductor memory device is operating normally.

18. The test method according to claim 17, further including providing a probe card having a pad pitch corresponding to one of the plurality of first channel pads and the plurality of second channel pads, and testing the semiconductor device using the probe card through the other of the plurality of first channel pads and the plurality of second channel pads.

19. The test method according to claim 18, wherein, when a first wafer test is completed through one of the plurality of first channel pads and the plurality of second channel pads, the method comprises performing a second wafer test through the other of the plurality of first channel pads and the plurality of second channel pads by laterally moving the wafer to be tested or the probe card by the pad pitch.

20. The test method according to claim 17, wherein the plurality of internal circuits comprises:
a plurality of input buffers for receiving a plurality of address signals, a plurality of data signals, and a plurality of control signals input through the plurality of pairs of first and second channel pads to output the signals after delaying the same for a predetermined time;
a plurality of internal input circuits for receiving the plurality of address signals, the plurality of data signals, and the plurality of control signals from the plurality of input buffers to perform independent operations, and outputting internal operation signals required for performing an internal operation of the semiconductor memory device;
a plurality of internal output circuits for receiving the internal operation signals from the plurality of internal input circuits to perform independent operations, and outputting output signals external to the semiconductor memory device; and
a plurality of output buffers for receiving the output signals output from the plurality of internal output circuits and outputting the signals after delaying the same for a predetermined time.

21. The test method according to claim 17, wherein the plurality of switches comprises:
a first switch for electrically connecting or disconnecting the plurality of first channel pads of the plurality of pairs of first and second channel pads to or from the plurality of input buffers or the plurality of output buffers;
a second switch for electrically connecting or disconnecting the plurality of second channel pads of the plurality of pairs of first and second channel pads to or from the plurality of input buffers or the plurality of output buffers; and
a third switch for electrically connecting or disconnecting the plurality of pairs of first and second channel pads to or from each other.

22. The test method according to claim 21, wherein the first and second switches are turned ON and the third switch is turned OFF during the normal mode,
the first and third switches are turned ON and the second switch is turned OFF during the first test mode, and
the second and third switches are turned ON and the first switch is turned OFF during the second test mode.

* * * * *